US011532367B2

(12) United States Patent
Xu et al.

(10) Patent No.: US 11,532,367 B2
(45) Date of Patent: Dec. 20, 2022

(54) MANAGING PROGRAMMING CONVERGENCE ASSOCIATED WITH MEMORY CELLS OF A MEMORY SUB-SYSTEM

(71) Applicant: Micron Technology, Inc., Boise, ID (US)

(72) Inventors: Jun Xu, San Jose, CA (US); Violante Moschiano, Avezzano AQ (IT); Erwin E. Yu, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/115,357

(22) Filed: Dec. 8, 2020

(65) Prior Publication Data

US 2022/0180952 A1 Jun. 9, 2022

(51) Int. Cl.
*G11C 16/08* (2006.01)
*G11C 16/34* (2006.01)
*G11C 16/26* (2006.01)
*G11C 16/24* (2006.01)
*G11C 16/10* (2006.01)

(52) U.S. Cl.
CPC .......... *G11C 16/3454* (2013.01); *G11C 16/08* (2013.01); *G11C 16/10* (2013.01); *G11C 16/24* (2013.01); *G11C 16/26* (2013.01); *G11C 16/3404* (2013.01)

(58) Field of Classification Search
CPC ..... G11C 16/3454; G11C 16/08; G11C 16/10; G11C 16/24; G11C 16/26; G11C 16/3404
USPC ..................................................... 365/185.22
See application file for complete search history.

(56) References Cited

U.S. PATENT DOCUMENTS

| 7,788,444 | B2* | 8/2010 | Lee | G11C 15/04 711/108 |
| 9,530,513 | B1* | 12/2016 | Pan | G11C 16/10 |
| 2011/0292724 | A1* | 12/2011 | Kim | G11C 16/3459 365/185.03 |

* cited by examiner

*Primary Examiner* — Hoai V Ho
*Assistant Examiner* — Minh Dinh
(74) *Attorney, Agent, or Firm* — Lowenstein Sandler LLP (57) ABSTRACT

A first programming pulse is caused to be applied to a wordline associated with a memory cell of the memory sub-system. In response to first programming pulse, causing a program verify operation to be performed to determine a measured threshold voltage associated with the memory cell. The measured threshold voltage associated with the memory cell is stored in a sensing node. A determination is made that the measured threshold voltage of the memory cell satisfies a condition and the measured threshold voltage stored in the sensing node is identified. A bitline voltage matching the measured threshold voltage is caused to be applied to a bitline associated with the memory cell.

20 Claims, 8 Drawing Sheets

MANAGING PROGRAMMING CONVERGENCE ASSOCIATED WITH MEMORY CELLS OF A MEMORY SUB-SYSTEM

TECHNICAL FIELD

Embodiments of the disclosure relate generally to memory sub-systems, and more specifically, relate to managing programming convergence associated with memory cells of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed managing programming convergence associated with memory cells of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or a three-dimensional grid. Memory cells are formed onto a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

To program data to a memory sub-system, an internal controller of the NAND can issue control signals to one or more row drivers to cause the row drivers to apply a voltage across the gates of a NAND device to trap charges (e.g., electrons) in a charge trap region of the NAND. The memory controller can apply the voltage in a pulse, known as a program pulse. The amount of voltage and the width of the pulse can determine the amount of charge that will be stored at the NAND device, and in turn programs the state of the NAND. In some instances, the memory controller can apply a program pulse, verify the state of the NAND, and then apply another program pulse if required to bring the cell to the intended voltage level. This pulse-verify-pulse sequence can ensure that the NAND is correctly programmed without applying a larger voltage that can cause more damage to the NAND.

As a memory sub-system ages, the voltage (Vt) distributions of the NAND states of the memory cells tend to widen and therefore a higher program pulse can be required toward the end of the life of a memory sub-system to ensure data can properly be read. Therefore, the memory controller in conventional memory systems uses a program pulse that accounts for end of life conditions (i.e., begins with a larger program pulse voltage and/or width). However, using a larger program pulse at the beginning of the life of the memory sub-system can reduce the life span of the memory component because the larger program pulses can cause more damage to the NAND components unnecessarily, than if lower program pulses were used instead.

Certain memory access operations performed on a block of a memory device involve the application of certain voltages to the wordlines, as well as the pre-charging of the bitlines. In order to confirm whether a memory cell in the block is in an erase state "1" or program state "0," a verification of a change in potential can be difficult to recognize unless the bitline is provided with a certain level of potential. Thus, certain devices apply a pre-charge voltage to increase the voltage of the bitline to a predetermined value in advance, followed by detecting a change in the voltage of the bitline when the bitline is applied to a memory cell by comparing the voltage of the bitline with the pre-charged voltage used as a reference. This pre-charging is performed frequently during memory access operations and, therefore, the time required for pre-charging has a large influence on data access time.

During certain memory access operations, one or more calculations are performed on the memory device prior to the pre-charging being initiated. One approach involves the use of selective slow program convergence (SSPC) to improve a program threshold voltage distribution width. In this approach, multiple pre-verify voltage levels are calculated prior to initiating the pre-charging. The memory cells are programmed with incrementally increased programming pulses applied to wordlines to which the memory cells are coupled. After each pulse, a program verify operation determines the threshold voltage for each cell. When the threshold voltage reaches a pre-verify threshold, only the bitline connected to that particular cell is biased with a fixed or static intermediate voltage that slows down the change in the $V_t$ of the cell. The other cells continue to be programmed at their normal pace. As the $V_t$ for each cell reaches the pre-verify level, it is biased with the intermediate voltage. All of the bitlines are biased with an inhibit voltage as their threshold voltages reach the verify voltage threshold.

According to this approach, each bitline that is coupled to a memory cell of the plurality of memory cells is selectively biased with a first bitline voltage in response to the threshold voltage of the associated memory cell reaching a pre-verify threshold voltage. The pre-verify threshold voltage is less than a verify threshold voltage. The applied bitline voltage is a fixed digital voltage (e.g., a voltage in the range of 0.5V to 0.9V) that is typically greater than 0V and less than the inhibit voltage (e.g., $V_{CC}$).

In this approach, the application of a fixed bitline voltage for memory cells that reached the pre-verify threshold level results in a program state width that is negatively impacted by a number of factors including the program gate step, Poison program noise, random sensing noise (e.g., random telegraph signal noise), charge change, etc. In particular, the use of a uniform bitline voltage requires the application of a smaller program gate step to maintain a target program state width, resulting in a large number of program pulses and slower programming times.

Aspects of the present disclosure address the above and other deficiencies by applying an analog or continuous voltage on the bitline that tracks or matches a threshold voltage associated with one or more memory cells of the memory sub-system. The program threshold voltage width target for a distribution of memory cells for a programming state is managed and maintained, in accordance with aspects of the present disclosure. In response to a command for the execution of a programming operation associated with one or more target memory cells of a selected wordline, a programming pulse is generated and applied to the selected wordline.

Following the programming pulse, a program verify operation (e.g., a read of the memory cell to determine its contents and a comparison of the read data with the desired data) is performed to determine if the memory cell has been properly programmed. If the program verify operation determines that the memory cell is not yet programmed with the desired data, the threshold voltage for the memory cell is checked to determine if it has reached a pre-verify voltage level for that particular programming state. When the threshold voltage for that particular programming state reaches the corresponding pre-verify voltage level, the programming of that particular cell is slowed down by applying an analog voltage level on the bitline coupled to the cell (e.g., biasing the bitline) during a subsequent programming pulse.

Advantageously, the analog or continuous voltage level on the bitline (herein the "analog bitline voltage level" or "continuous bitline voltage level") is an analog match of the threshold voltage of the target memory cell. A sensing node of a sensing circuit associated with the target memory cell can be employed to store the threshold voltage of the target memory cell following the program verify operation and comparison of the measured threshold voltage of the memory cell with the pre-verify voltage level. Following the program verify operation, the sensing node associated with the target memory cell can store the measured threshold voltage of the target memory cell.

During a next programming pulse at the stepped or increased level, the sensing node is sensed to identify the measured threshold voltage and set the continuous bitline voltage level to match the measured threshold voltage. Accordingly, during a stage where the threshold voltage of the target memory cell is between the pre-verify voltage level and the program verify threshold voltage, the analog bitline voltage level matching the threshold voltage as sensed using the sensing node is applied to the bitline associated with the memory cell to slow the programming of the target memory cell. Advantageously, the programming of each cell that has passed the pre-verify threshold is selectively slowed for the particular state being programmed into the memory cell by the application of the analog bitline voltage level that is based on the threshold voltage level of the memory cell. Other cells being programmed are unaffected by the bitline biasing of the target memory cell at the analog bitline voltage level and are allowed to be programmed at their normal programming speed. This results in an improved narrowing the threshold voltage distribution to maintain a target distribution width using larger program gate step levels resulting in fewer program pulses, and faster programming times, without reducing the programming throughput.

In one embodiment, an isolation element and a dynamic memory element are included between a logic element (e.g., sense amplifier (SA) latch) in a page buffer circuit and one or more bitline drivers used to perform pre-charging operations on the bitlines of the memory device. In one embodiment, the logic element performs any calculations (e.g., elaborations) associated with a present memory access operation and passes a calculation result to the dynamic memory element which is designed to store the result for a given period of time. In one embodiment, the dynamic memory element can include one or more semiconductor devices, as well as associated signal routing lines, which can be sized to present adequate capacitance to store the result for the given period of time. Once the result is stored in the dynamic memory element, the isolation element can disconnect the logic element from the dynamic memory element. During the subsequent given period of time, the one or more bitline drivers can access the dynamic memory element and perform a pre-charging operation on the bitlines of the memory device, at least partially according to the calculation result stored in the dynamic memory element. Since the logic element is isolated from the dynamic memory element during the given period of time, the logic element can initiate performance of subsequent calculations while the pre-charging is occurring using the result of previous calculations. Once the concurrent pre-charging and subsequent calculations are complete, the isolation element can reconnect the logic element to the dynamic memory element, causing the result of the subsequent calculations to be stored in the dynamic memory element and a subsequent pre-charging operation can be performed without the delay normally associated with performing the subsequent calculations.

Advantages of this approach include, but are not limited to, the ability to perform pre-charging of bitlines using previous calculations while concurrently performing subsequent calculations to be used in a subsequent pre-charging operation. Accordingly, latency associated with memory access operations is reduced and performance of the memory device is improved.

Figure 1:
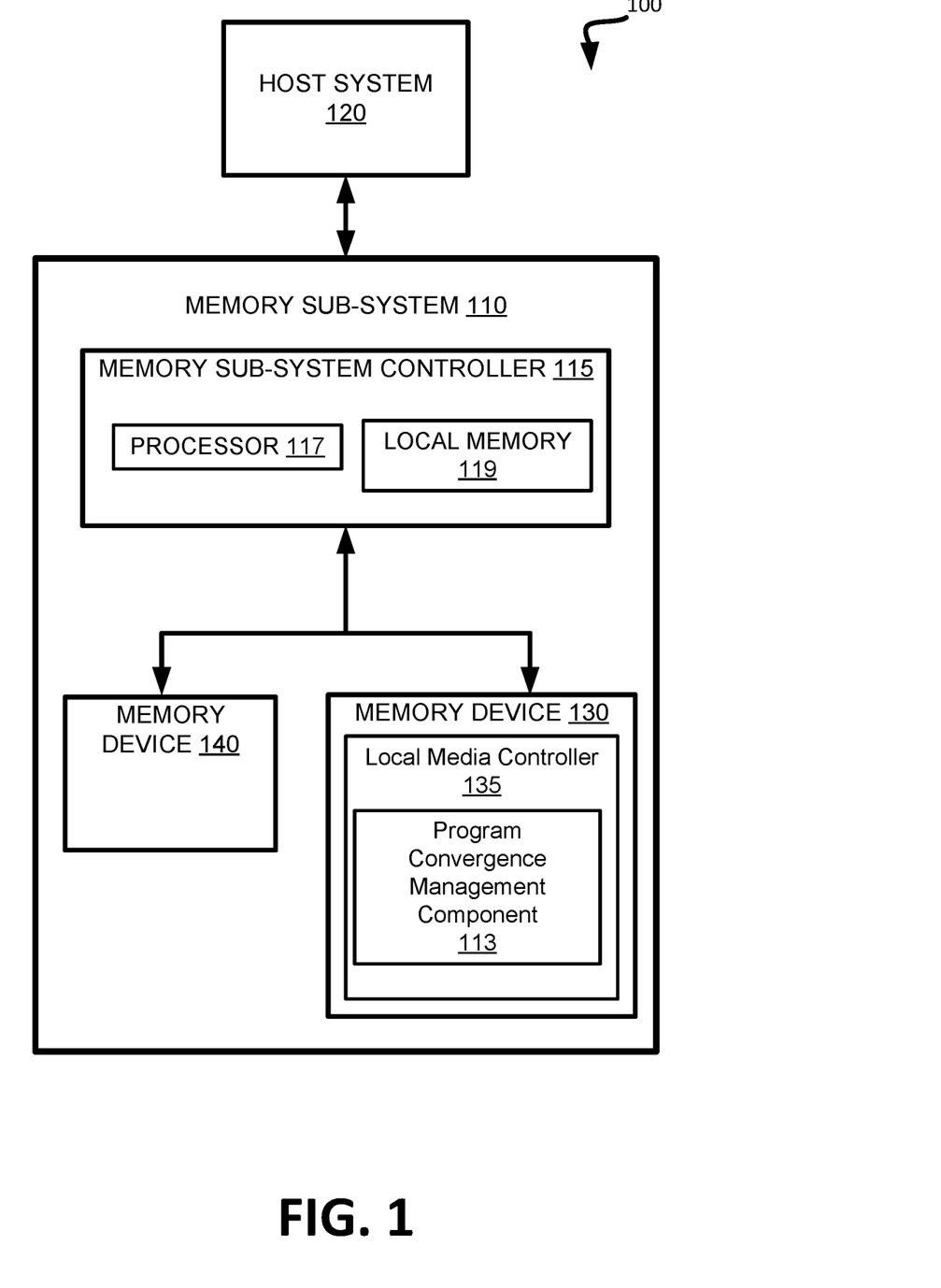
FIG. 1 illustrates an example computing system that includes a memory sub-system in accordance with some embodiments of the present disclosure.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the local media controller 135 of the memory device 130 includes a program convergence management component 113 that can be used to manage programming convergence associated with memory cells of memory device 130. In some embodiments, the local media controller 135 includes at least a portion of the program convergence management component 113.

In some embodiments, the memory sub-system controller 115 includes at least a portion of the program convergence management component 113. For example, the controller 115 can include a processor 117 (processing device) configured to execute instructions stored in local memory 119 for performing the operations described herein. In some embodiments, the program convergence management component 113 is part of the host system 110, an application, or an operating system.

The program convergence management component 113 can reduce a program threshold voltage distribution width of a programming distribution by slowing programming convergence associated with selected memory cells of a memory sub-system. The program convergence management component 113 manages the convergence by causing a bitline of one or more selected memory cells to be biased with an analog or continuous voltage level that is proportional or matches a threshold voltage associated with the one or more selected memory cells to reduces the voltage drop across a memory cell transistor, thereby reducing the effective programming voltage applied to the one or more selected memory cells. Lowering the programming voltage applied during a subsequent programming pulse results in a slowing of the movement of the threshold voltage for the one or more selected memory cells. In one embodiment, the bitline bias voltage ($V_{BL}$) is adjusted or set to a value that is determined by sensing a node storing a threshold voltage value identified during a previous program verify operation (e.g., sensing node.

In an embodiment, the program convergence management component 113 identifies a requested operation (e.g., a request for a program operation received from the host system 120) and causes a first programming pulse to be applied to a memory cell (also referred to as a "targeted memory cell"). The program convergence management component 113 causes a program verify operation to be performed on the target memory cell to determine if the threshold voltage of the targeted memory cell reaches or exceeds a programming voltage level (e.g., to determine if the targeted memory cell has been programmed). In an embodiment, the program convergence management component 113 determines that a measured threshold voltage of the targeted memory cell is less than the programming threshold voltage.

In an embodiment, the program convergence management component 113 manages a storage location (e.g., a cache location or node) of a sensing circuit (e.g., sensing circuit 700 of FIG. 7) associated with the targeted memory cell (herein referred to as the "sensing node"). In an embodiment, the sensing node stores the measured voltage level associated with the program verify operation. In an embodiment, the measured voltage level matches or is proportional to the threshold voltage of the memory cell.

In an embodiment, the measured voltage level identified during the program verify operation is compared to a pre-verify voltage level. In an embodiment, each programming state is associated with a pre-verify voltage level, such that, when the measured threshold voltage for that particular state reaches the corresponding pre-verify voltage level, the program convergence management component 113 determines that the programming of that particular memory cell is to be slowed down by biasing the bitline coupled to the memory cell with the bitline voltage.

In an embodiment, the program convergence management component 113 identifies one or more selected memory cells that, as determined by the program verify operation, are not yet programmed and have a measured voltage level that exceed the pre-verify voltage level (e.g., a memory cell having a measured voltage that is between the pre-verify voltage level and the programming voltage level).

In an embodiment, the program convergence management component 113 slows the programming of a selected memory cell by causing an adjusted bitline voltage to be applied to a bitline corresponding to the selected memory cell. In an embodiment, the program convergence management component 113 identifies the measured voltage level stored in the sensing node, which matches or is proportional to the threshold voltage of the memory cell, and causes the bitline voltage to be adjusted or set to the measured voltage level. In an embodiment, the program convergence management component 113 causes the adjusted bitline voltage to be applied to the bitline in connection with one or more subsequent programming pulses until the memory cell is programmed. In an embodiment, once the memory cell is programmed, the program convergence management component 113 causes the bitline to be biased with an inhibit voltage level (e.g., $V_{cc}$) to inhibit or block programming of the memory cell. Further details with regards to the operations of the program convergence management component 113 are described below.

Figure 2:
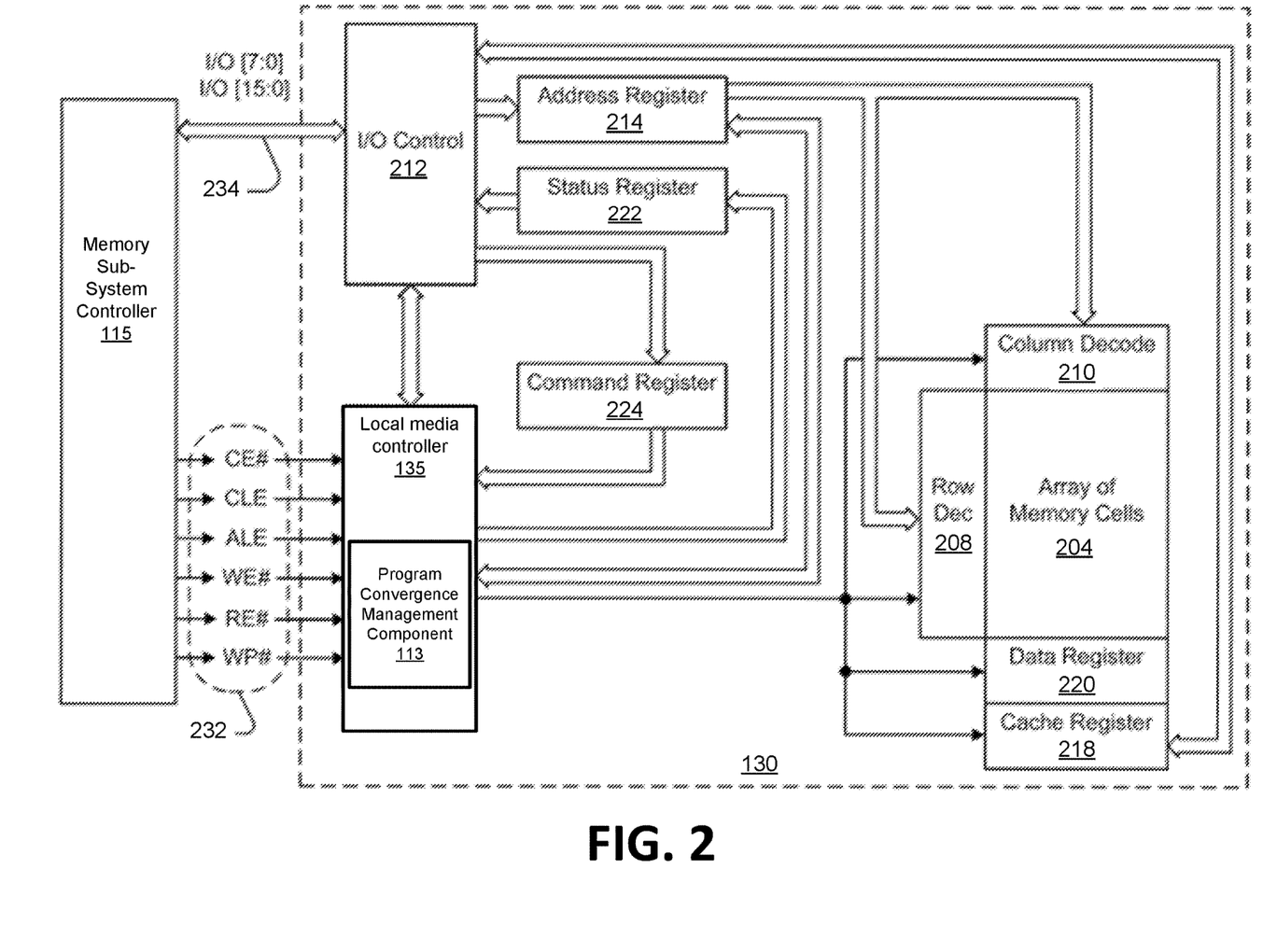
FIG. 2 is a block diagram of a memory device in communication with a memory sub-system controller of a memory sub-system, in accordance with one or more embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data may be passed from the cache register 218 to the data register 22 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals may include a chip enable CE #, a command latch enable CLE, an address latch enable ALE, a write enable WE #, a read enable RE #, and a write protect WP #. Additional or alternative control signals (not shown) may be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) may be used in the various embodiments.

Figure 3:
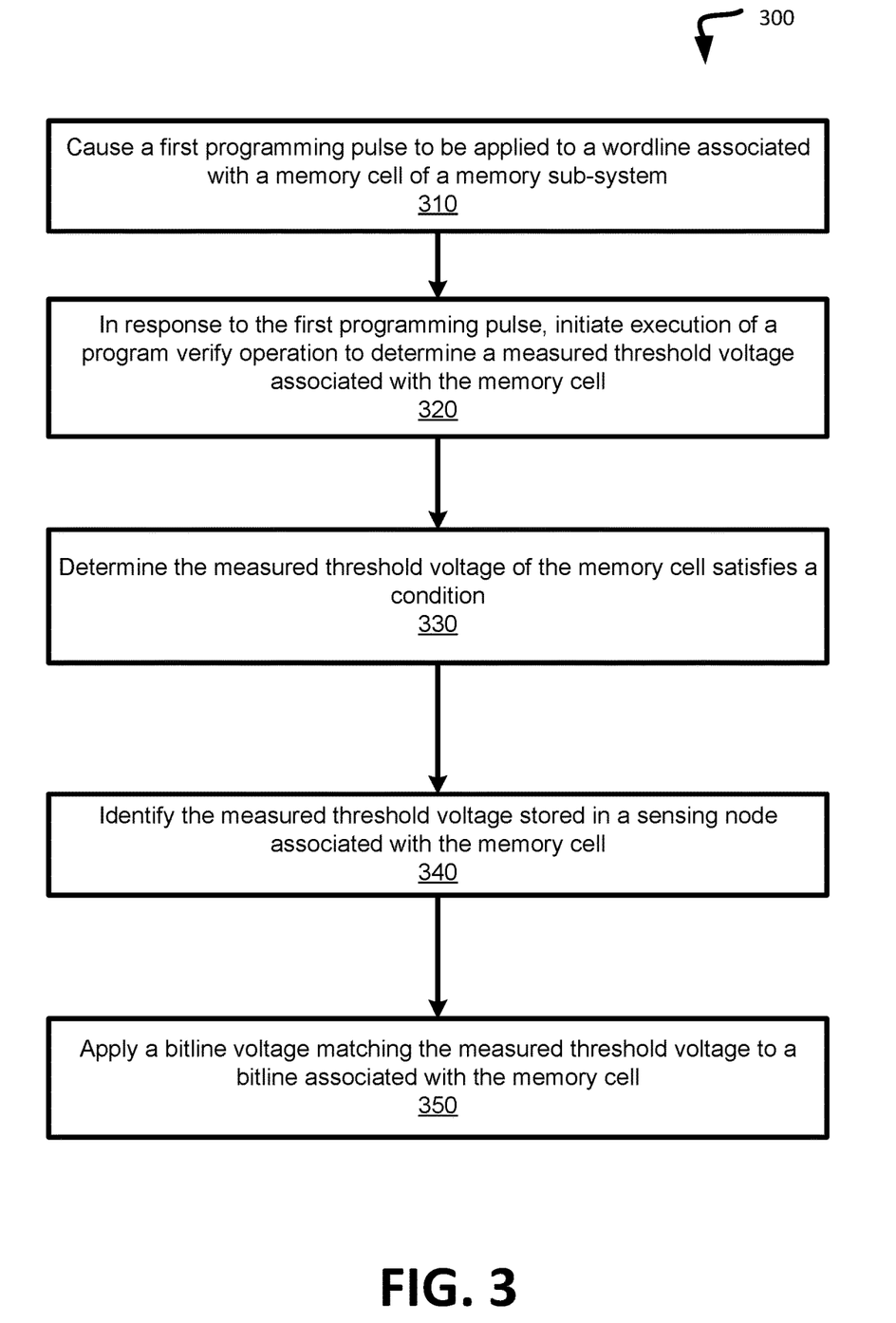
FIG. 3 is a flow diagram of an example method 200 to manage programming convergence associated with memory cells of a memory sub-system, in accordance with one or more embodiments of the present disclosure.

FIG. 3 is a flow diagram of an example method 300 to manage programming convergence associated with memory cells of a memory sub-system, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is managed by the program convergence management component 113 of FIG. 1. In an embodiment the program convergence management component 113 issues commands to cause one or more row drivers of the memory device 130 to apply a programming pulse. In an embodiment, the program convergence management component 113 manages aspects of the method 300 using sense circuitry, an example of which is shown FIG. 7.

At operation 310, a programming pulse is applied. For example, the processing logic (e.g., program convergence management component 113) causes a first programming pulse to be applied to a wordline associated with a memory cell of a memory sub-system. In an embodiment, the processing logic issues a command to cause one or more row drivers associated with the memory cell to apply the programming pulse to the wordline. In an embodiment, the first programming pulse is applied in response to a programming operation request received from a host system. In an embodiment, the programming operation identifies a desired data or programming value to be stored in the memory cell. In an embodiment, the first programming pulse is generated and applied to the wordline of the selected memory cell. In an embodiment, the first programming pulse is an initial pulse of a series of incrementing voltage programming pulses and has a first or initial voltage value that is based on a predetermined programming voltage associated with the desired data value.

In operation 320, a program verify operation is performed. For example, in response to the first programming pulse, the processing logic initiates execution of a program verify operation to determine a measured threshold voltage associated with the memory cell. In an embodiment, the program verify operation is performed by a combination of the processing logic and sense circuitry associated with the memory cell of the memory sub-system. The measure of the Vt is stored by elements of the sense circuitry too.

In an embodiment, the program verify operation involves a read operation applied to the memory cell to determine if the data stored in the memory cell matches the desired data value. In an embodiment, the processing logic determines that the memory cell is not programmed to the desired data value (e.g., a measured threshold voltage of the memory cell is less than a programming threshold level (also referred to as the pre-verify voltage level ($V_{pv}$) associated with the desired programming state).

In an embodiment, a sensing node (e.g., sensing node 718 of FIG. 7) associated with the memory cell stores the measured threshold voltage associated with the memory cell. In an embodiment, the sensing node can be a temporary storage location (e.g., a cache storage) of a sensing circuit (e.g., sensing circuit 700 of FIG. 7) associated with the memory cell. In an embodiment, the measured threshold voltage identified during the program verify operation matches or is proportional to the threshold voltage of the memory cell.

In operation 330, a determination is made. For example, the processing logic determines that the measured threshold voltage of the memory cell satisfies a condition. In an embodiment, the condition is satisfied if the measured threshold voltage is between a pre-verify voltage level ($V_{pre\text{-}verify}$) and the program verify voltage ($V_{pv}$). In an embodiment, each programming state has a pre-verify voltage level that is less than the associated program verify voltage level. In an embodiment, the condition is satisfied if the measured threshold voltage is greater than the pre-verify voltage level and less than the program verify voltage level. In response to determining the condition is satisfied, the processing logic identifies or selects the associated memory cell to have its programming slowed down to manage the associated program convergence.

In operation 340, a threshold voltage is identified. For example, the processing logic identifies the measured threshold voltage stored in the sensing node (e.g., Vt 719 stored in sensing node 718 of FIG. 7). As described above with respect to operations 320 and 330, the measured threshold voltage is maintained in the sensing node which can be accessed or read to identify the measured threshold voltage of the selected memory cell.

In operation 350, a bitline voltage is applied. For example, the processing logic causes a bitline voltage matching the measured threshold voltage to be applied to a bitline associated with the memory cell. In an embodiment, the processing logic causes the bitline coupled to the memory cell to be biased with the adjusted bitline value that tracks or matches the threshold voltage of the memory cell. The application of this analog or adjusted bitline voltage to the bitline reduces the voltage drop across the memory cell transistor, thereby reducing the effective programming voltage applied to the cell during the subsequent programming pulse (e.g., a second programming pulse).

Figure 4:
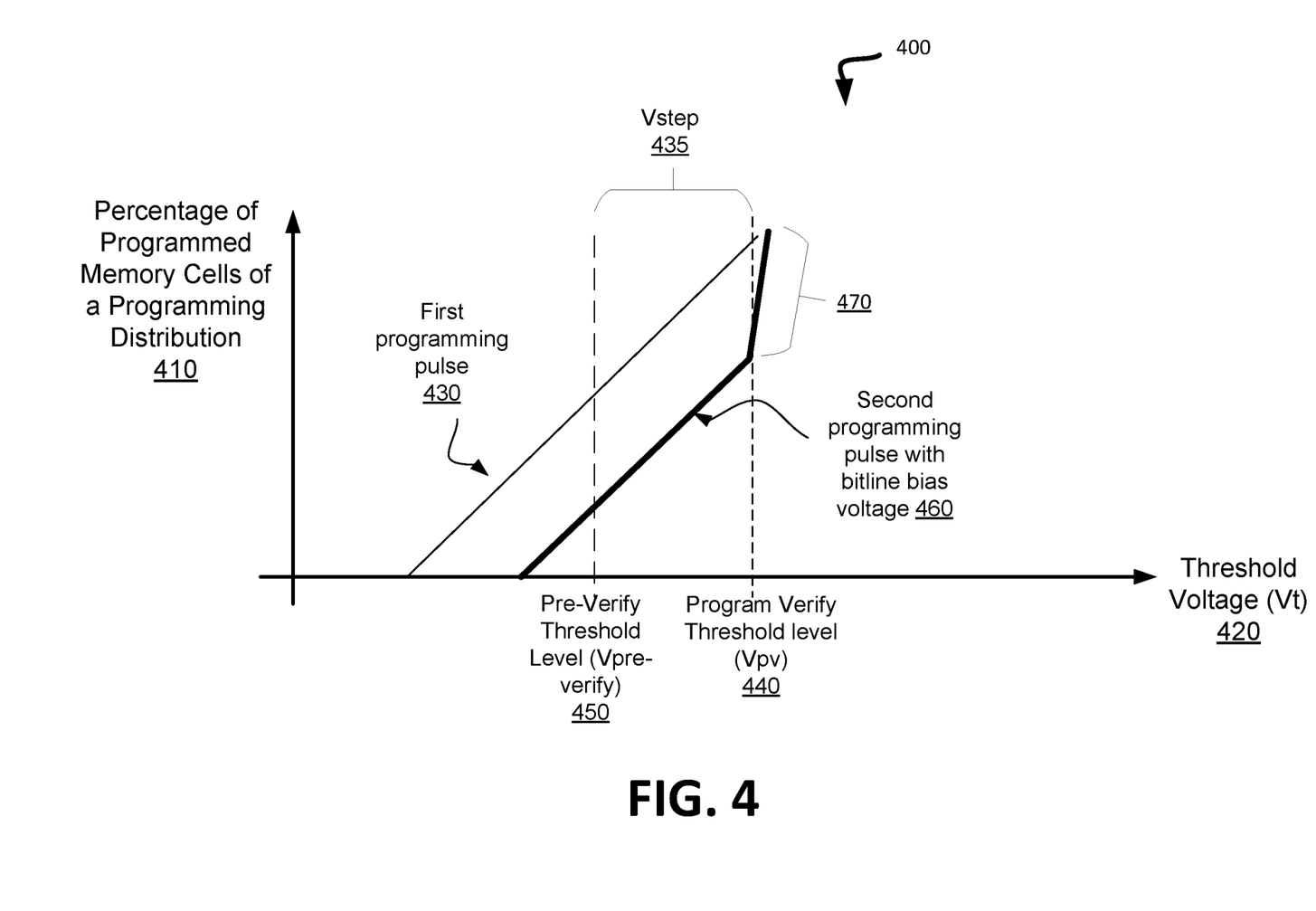
FIG. 4 illustrates an example graph including a representation of the managing of programming convergence associated with memory cells using a bitline voltage proportional to a threshold voltage of the memory cell, in accordance with one or more embodiments of the present disclosure.

FIG. 4 illustrates an example graph 400 including a representation of the managing of programming convergence associated with memory cells using a bitline voltage proportional to a threshold voltage of the memory cell, according to embodiments. As shown, the graph 400 includes a plot of a percentage of programmed memory cells of a programming distribution 410 as a function of a corresponding threshold voltage 320. In an embodiment, the memory cells are subjected to a series of programming pulses (e.g., a first programming pulse 430 and a second programming pulse 440) to program the respective memory cells to a particular programming state. The programming pulses 430, 460 are incremented by a step voltage (Vstep) 435, as shown in FIG. 4.

As illustrated in FIG. 3, a first programming pulse 430 is applied at a first voltage level. A program verify operation is performed to compare the measured threshold voltages of the memory cells to a program verify threshold level ($V_{pv}$) 440. As illustrated, the threshold voltage of the memory cells as measured in the program verify operation following the first programming pulse 430 are less than the program verify threshold level 440, and, as such, none of the memory cells are programmed as a result of the first programming pulse 430.

In an embodiment, the measured threshold voltage of each memory cell is compared to a pre-verify threshold level ($V_{pre-verify}$) 450. As shown, the pre-verify threshold level 450 is less than the program verify level 440 and can be used to identify memory cells that are approaching a programming state for which the slowing of programming is desired. In an embodiment, for the one or more memory cells having a measured threshold voltage that is between the pre-verify threshold level 450 and the program verify level 440, an adjusted bitline voltage is applied to the respective bitlines during a second program pulse. As shown, during the second program pulse 460 including the bitline biasing voltage, the programming of the selected memory cells (e.g., the memory cells having a threshold voltage that is greater than the pre-verify threshold level and less than the program verify threshold level) is slowed, as indicated by the line portion 470.

Figure 5:
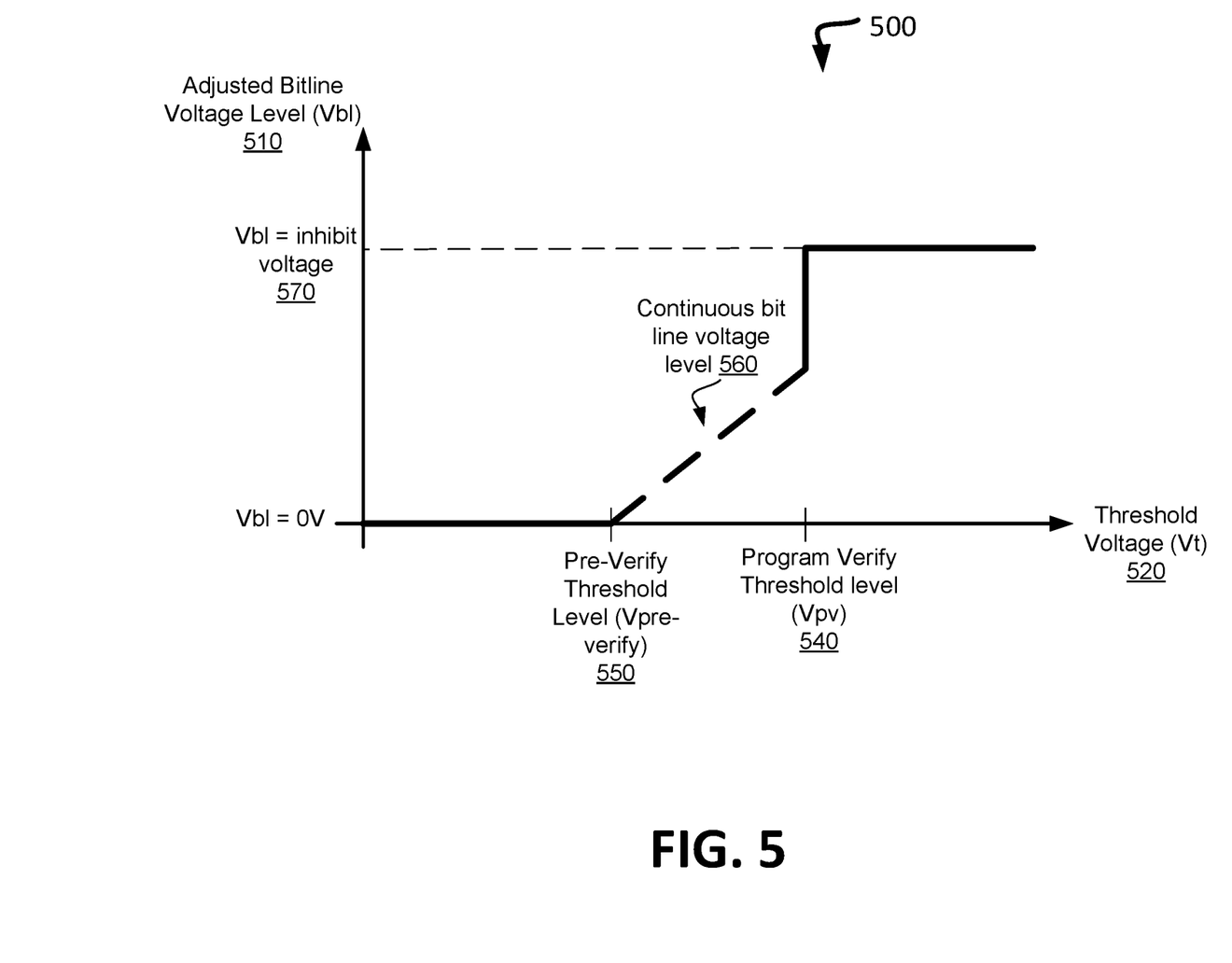
FIG. 5 illustrates an example graph including a representation of the application of an adjusted bitline voltage to selected memory cells to manage programming convergence associated with the memory cells, in accordance with one or more embodiments of the present disclosure.

FIG. 5 illustrates an example graph 500 including a representation of the application of an adjusted bitline voltage ($V_{bl}$) 510 to selected memory cells to manage programming convergence associated with the memory cells, according to embodiments. As shown, the graph 400 includes a plot of the adjusted bitline voltage 510 applied during a series of programming pulses as a function of a corresponding threshold voltage 520. As shown in FIG. 5, the memory cells are subjected to the series of programming pulses (e.g., the first programming pulse 530 and the second programming pulse 540) to program the respective memory cells to a particular programming state.

During the first programming pulse, the adjusted bitline voltage is set to 0V (e.g., no biasing of the bitline is performed). As illustrated in FIG. 5, a continuous or analog bitline voltage level 560 is applied to the bitline during a second programming pulse of memory cells for certain identified or selected memory cells. The selected memory cells are identified during a pre-verify operation associated with the first programming pulse as having a threshold voltage between the pre-verify threshold level 550 and the program verify threshold level 540.

Figure 6:
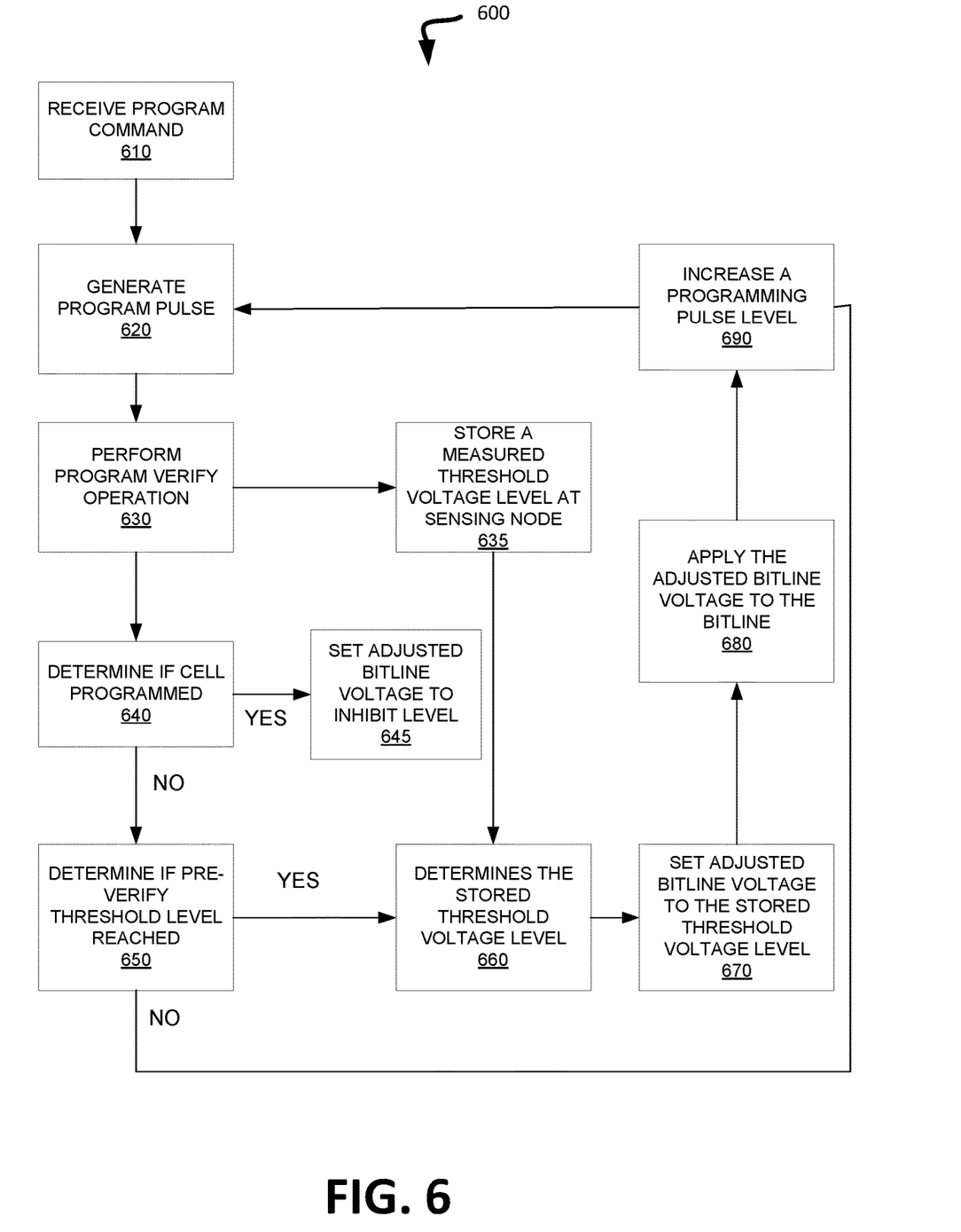
FIG. 6 is a flow diagram of an example method 500 to manage programming convergence associated with memory cells of a memory sub-system, in accordance with one or more embodiments of the present disclosure.

FIG. 6 is a flow diagram of an example method 600 to manage programming convergence associated with memory cells of a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the program convergence management component 113 of FIG. 1.

At operation 610, a command is received. For example, the processing logic (e.g., program convergence management component 113) receives a command, such as a command to program data to one or more memory cells. In response to the command, at operation 620, a program pulse is generated. For example, the processing logic causes a programming pulse (e.g., the first programming pulse 430 of FIG. 4) to be generated and applied to the selected wordline. In an embodiment, during the programming pulse applied in operation 620, no bias voltage is applied to the bitline associated with the selected wordline.

At operation 630, a program verify operation is performed. For example, the processing logic performs a program verify operation to determine if the memory cell has been properly programmed. In one embodiment, the processing logic reads the voltage level stored in the memory cell and compares that level to a desired level to confirm whether the voltage level has reached the desired level. At operation 640, a determination is made. For example, the processing logic can determine whether the cell was properly programmed. In one embodiment, if the voltage level read during the program verify operation has reached the desired level, the processing logic determines that the memory cell was properly programmed. If, at operation 640, the memory cell has been programmed, at operation 645, the bitline is biased at a program inhibit voltage level. In one embodiment, the adjusted bitline voltage is increased from the 0V bitline biasing used during the first programming pulse an inhibit voltage (e.g., $V_{CC}$).

At operation 635, a threshold voltage is stored. For example, the processing logic can store the measured threshold voltage identified during the program verify operation 630 in a storage location (e.g., a sensing node) associated with the memory cell.

If, at operation 640, the processing logic determines that the memory cell is not yet programmed with the desired data, at operation 650, a determination is made. For example, the processing logic can check the measured threshold voltage for the memory cell to determine if it has reached a pre-verify voltage level. In an embodiment, each programming state has a pre-verify voltage level at which, when the threshold voltage for that particular state reaches that level, the programming of that particular memory cell is slowed down by biasing the bitline coupled to the memory cell. As shown in FIG. 6, if the processing logic determines that the measured threshold level is below the pre-verify threshold level, the processing logic increases a programming pulse level (e.g., by the $V_{step}$ value of FIG. 4) at operation 680 and returns to operation 620 to generate a next programming pulse at the stepped value.

In an embodiment, if the processing logic determines that the measured threshold level has reached the pre-verify threshold level at operation 650, the method 600 proceeds to operation 660. In operation 660, a determination is made. For example, the processing logic determines the threshold voltage level stored at the sensing node in operation 635.

Having identified the measured and stored threshold voltage of the memory cell resulting from the program verify operation 630, at operation 680, a bitline voltage is set. For example, the processing logic sets the adjusted bitline voltage to the stored threshold voltage level.

In operation 680, a bitline voltage is applied. For example, the processing logic causes the adjusted bitline voltage to be applied to the bitline of the selected memory cell during a next generated programming pulse.

Advantageously, the processing logic selectively slows the programming of each memory cell that has passed the pre-verify threshold for the particular state being programmed into the memory cell by applying a continuous bitline voltage corresponding to the measured threshold voltage level. In an embodiment, other memory cells (e.g., the memory cells having a measured threshold voltage that is not between the pre-verify threshold level and the program verify threshold level) being programmed are unaffected by the bitline biasing and are allowed to be programmed at their normal programming speed, thereby producing the beneficial effect of efficiently narrowing the threshold voltage distribution without reducing the programming throughput.

Figure 7:
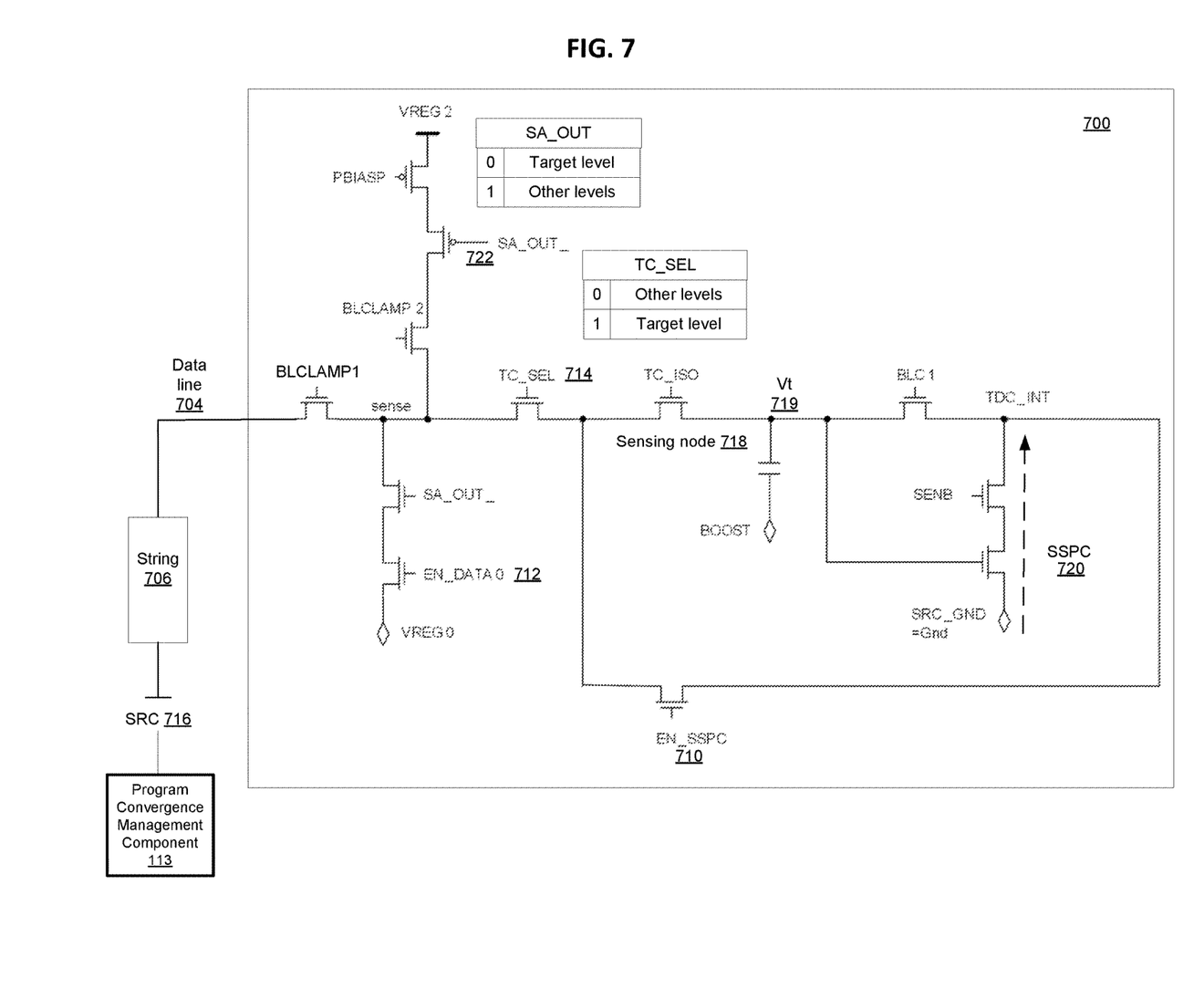
FIG. 7 illustrates example sense circuitry in communication with a program convergence management component of a memory sub-system, in accordance with one or more embodiments of the present disclosure.

FIG. 7 is a schematic of an example sense circuit 700 as might be used with embodiments. Sense circuit 700 is shown connected to a particular memory string 706 by a particular data line 704 (e.g., a bitline), such as shown in more detail in FIG. 7, for example. While the discussion is directed to use of the sense circuit 700 with a NAND string 706 from a source (SRC) 716 associated with a program convergence management component 113, other memory structures and architectures are suitable for use with sense circuit 700 where a current path can be selectively created from the data line 704 to the source 716 dependent upon a data state of a memory cell selected for sensing.

In an embodiment, the sense circuit 700 includes multiple sense nodes (e.g., transistors 710, 712, and 714 to send and store the threshold voltage. In an embodiment, node 714 is on (e.g., "1") for the target level and off (e.g., "0") for the memory cells that have completed the program verify operation such that the sensing node 718 stores or maintains the threshold voltage information. In an embodiment, after a program verify operation, the sensing node 718 can be probed to determine the stored threshold voltage (Vt) 719 of the memory cell (e.g., at operations 635 and 660 of FIG. 6).

In an embodiment, the program verify operation is performed by a combination of the program convergence management component (e.g., program convergence management component 113 of FIG. 1) and the sense circuit 700 of FIG. 7.

In an embodiment, the sense circuit 700 may be a component of a data register (e.g., data register 220 of FIG. 2 and its output sa_out may be provided as an input to a cache register (e.g., cache register 218 of FIG. 2) for output of the sensed data state from the memory device 130. The output signal sa_out on output line 722 may comprise a signal generated by a latch (e.g., latch circuit) which is representative of a logic level, such as a logic 'high' (e.g., represented by Vcc) or logic 'low' (e.g., represented by VSS) level indicative of a sensed data state of a selected memory cell of NAND string 206, for example.

In an embodiment, control signals of the sense circuit 400 may be provided by the program convergence management component 113 of an internal controller of the memory device (e.g., local media controller 135 of FIG. 1 and FIG. 2. In an embodiment, the control signals (e.g., both voltage levels and timing) are defined by the sense operation and are distinguished from signals generated in response to performing the sense operation (e.g., the output signal sa_out or a voltage level generated on the sensing node 718).

Figure 8:
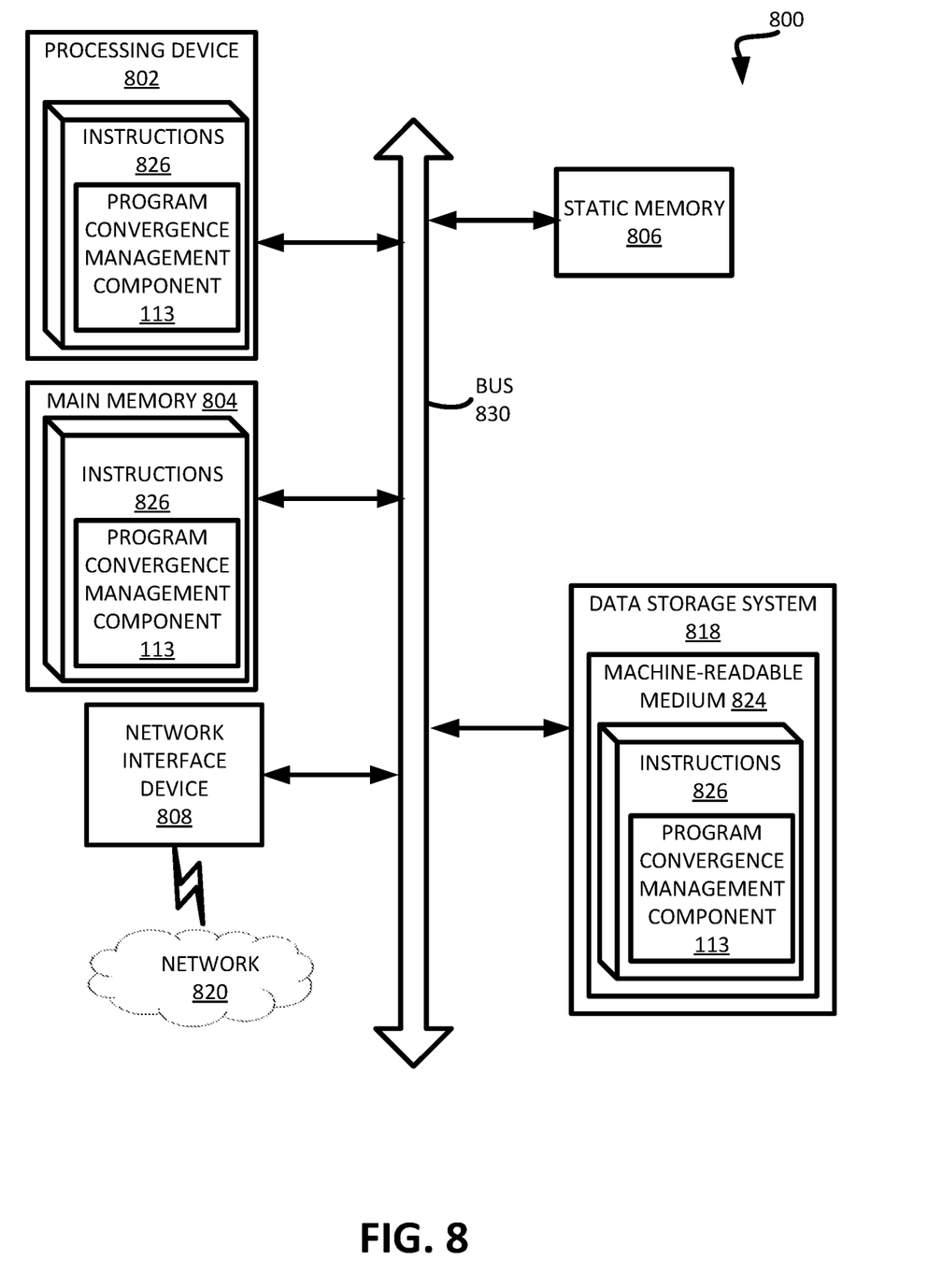
FIG. 8 is a block diagram of an example computer system in which implementations of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan threshold management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a selective relocation component (e.g., the program convergence management component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
causing a first programming pulse to be applied to a wordline associated with a memory cell of a memory device;
in response to the first programming pulse, causing a program verify operation to be performed on the memory cell to determine a measured threshold voltage associated with the memory cell;
storing, in a sensing node associated with the memory cell, the measured threshold voltage associated with the memory cell;
determining that the measured threshold voltage of the memory cell satisfies a condition;
identifying the measured threshold voltage stored in the sensing node; and
causing, during a second programming pulse, a bitline voltage matching the measured threshold voltage to be applied to a bitline associated with the memory cell.

2. The method of claim 1, further comprising comparing the measured threshold voltage to a pre-verify threshold level.

3. The method of claim 2, wherein the condition is satisfied when the measured threshold voltage of the memory cell is greater than the pre-verify threshold level and less than a program verify threshold level associated with the program verify operation.

4. The method of claim 1, further comprising causing the second programming pulse to be applied to the wordline associated with the memory cell, wherein the bitline voltage is applied to the bitline associated with the memory cell during application of the second programming pulse.

5. The method of claim 1, further comprising receiving, from a host system, a command to execute a program operation to program the memory cell to a programming state.

6. The method of claim 5, further comprising:
in response to the second programming pulse, causing a further program verify operation to be performed on the memory cell.

7. The method of claim 6, further comprising:
- determining, in view of the further program verify operation, that the memory cell is programmed to the programming state; and
- in response to determining that the memory cell is programmed to the programming state, causing a subsequent bitline voltage matching an inhibit voltage level to be applied to the bitline associated with the memory cell.

8. The method of claim 1, further comprising causing the second programming pulse to be applied to the wordline associated with the memory cell.

9. A non-transitory computer readable medium comprising instructions, which when executed by a processing device, cause the processing device to perform operations comprising:
- causing a first programming pulse to apply to a memory cell of a memory device to be generated;
- causing a program verify operation to compare a threshold voltage of the memory cell to a program verify threshold voltage to be performed on the memory cell;
- in response to a condition being satisfied, identifying the threshold voltage of the memory cell stored in a storage location associated with the memory cell; and
- causing, during a second programming pulse, a bitline voltage matching the threshold voltage to be applied to a bitline associated with the memory cell.

10. The non-transitory computer readable medium of claim 9, wherein the condition is satisfied in response to:
- determining, in view of the program verify operation, that the threshold voltage is less than the program verify threshold voltage; and
- determining the threshold voltage is greater than a pre-verify threshold voltage, wherein the pre-verify threshold voltage is less than the program verify threshold voltage.

11. The non-transitory computer readable medium of claim 9, wherein causing the bitline voltage matching the threshold voltage to be applied to the bitline associated with the memory cell reduces a rate of programming associated with the memory cell.

12. The non-transitory computer readable medium of claim 9,
- in response to the second programming pulse, causing a further program verify operation to be performed on the memory cell;
- determining, in view of the further program verify operation, that the memory cell is programmed to a programming state; and
- in response to determining the memory cell is programmed to the programming state, causing a subsequent bitline voltage matching an inhibit voltage level to be applied to the bitline associated with the memory cell.

13. A memory device comprising:
- a memory array; and
- control logic, operatively coupled with the memory array, to perform operations comprising:
  - causing a first programming pulse to be applied to a wordline associated with a memory cell of the memory array;
  - in response to the first programming pulse, causing a program verify operation to be performed on the memory cell to determine a measured threshold voltage associated with the memory cell;
  - storing, in a sensing node associated with the memory cell, the measured threshold voltage associated with the memory cell;
  - determining that the measured threshold voltage of the memory cell satisfies a condition;
  - identifying the measured threshold voltage stored in the sensing node; and
  - causing, during a second programming pulse, a bitline voltage matching the measured threshold voltage to be applied to a bitline associated with the memory cell.

14. The memory device of claim 13, the operations further comprising comparing the measured threshold voltage to a pre-verify threshold level.

15. The memory device of claim 14, wherein the condition is satisfied when the measured threshold voltage of the memory cell is greater than the pre-verify threshold level and less than a program verify threshold level associated with the program verify operation.

16. The memory device of claim 13, the operations further comprising causing the second programming pulse to be applied to the wordline associated with the memory cell.

17. The memory device of claim 13, the operations further comprising receiving, from a host system, a command to execute a program operation to program the memory cell to a programming state.

18. The memory device of claim 17, the operations further comprising:
- in response to the second programming pulse, causing a further program verify operation to be performed on the memory cell.

19. The memory device of claim 18, the operations further comprising:
- determining, in view of the further program verify operation, that the memory cell is programmed to the programming state.

20. The memory device of claim 19, the operations further comprising:
- in response to determining that the memory cell is programmed to the programming state, causing a subsequent bitline voltage matching an inhibit voltage level to be applied to the bitline associated with the memory cell.

* * * * *